United States Patent [19]

Riley et al.

[11] 4,287,259
[45] Sep. 1, 1981

[54] PREPARATION AND USES OF AMORPHOUS BORON CARBIDE COATED SUBSTRATES

[75] Inventors: Robert E. Riley; Lawrence R. Newkirk, both of Los Alamos; Flavio A. Valencia, Santa Fe; Wallace, Sr., Terry C., Los Alamos, all of N. Mex.

[73] Assignee: The United States of America as represented by the United States Department of Energy, Washington, D.C.

[21] Appl. No.: 100,754

[22] Filed: Dec. 5, 1979

[51] Int. Cl.³ .............................................. B32B 9/00
[52] U.S. Cl. .............................. 428/408; 156/306.3; 156/324.4; 264/134; 264/258; 423/291; 427/249; 427/255.2; 427/255.7; 428/902
[58] Field of Search .................... 156/306.3, 324.4; 423/291; 264/134, 258; 428/408, 902; 427/255.2, 255.7, 249

[56] References Cited

U.S. PATENT DOCUMENTS

| | | | |
|---|---|---|---|
| 3,269,802 | 8/1966 | Wainer et al. ................ | 264/29.2 |
| 3,294,880 | 12/1966 | Turkat ................ | 264/29.2 |
| 3,334,967 | 8/1967 | Bourdeau ................ | 423/291 |
| 3,340,020 | 9/1967 | Neuenschwander et al. ........ | 423/291 |
| 3,367,826 | 2/1968 | Heestand et al. ................ | 427/249 |
| 3,369,920 | 2/1968 | Bourdeau et al. ................ | 427/249 |
| 3,464,843 | 9/1969 | Basche ................ | 427/249 |
| 3,529,988 | 9/1970 | Woerner ................ | 427/249 |
| 3,537,877 | 11/1970 | Reeves et al. ................ | 427/249 |
| 3,668,006 | 6/1972 | Higgins et al. ................ | 428/902 |
| 3,729,372 | 4/1973 | Matchen et al. ................ | 428/427 |
| 3,799,830 | 3/1974 | Allen ................ | 156/324.4 |
| 3,799,830 | 3/1974 | Allen ................ | 427/249 |
| 3,846,224 | 11/1974 | Leclercq et al. ................ | 427/249 |
| 3,860,443 | 1/1975 | Lachman et al. ................ | 427/214 |
| 3,967,029 | 6/1976 | Veltri et al. ................ | 428/902 |
| 3,977,294 | 8/1976 | Jahn ................ | 428/408 |
| 3,991,248 | 11/1976 | Bauer ................ | 427/249 |
| 4,180,428 | 12/1979 | Riley et al. ................ | 427/249 |

FOREIGN PATENT DOCUMENTS 1089785  11/1967  United Kingdom ............ 427/249

OTHER PUBLICATIONS

Pfeifer, "Graphite/Aluminum Technology Development", Chapter 6, pp. 159–168 and 212–215 in *Hybrid and Select Metal–Matrix Composites: A State of the Art Review*, edited by Dr. W. J. Renton, published by American Institute of Aeronautics and Astronautics, (1977).
Morin, "Boron Carbide Coated Boron Filament as Reinforcement in Aluminum Alloy Matrices", *Journal of the Less-Common Metals*, 47 (6–1976), pp. 207–213.

*Primary Examiner*—John J. Gallagher
*Attorney, Agent, or Firm*—Elizabeth O. Slade; Paul D. Gaetjens; Richard G. Besha

[57] ABSTRACT

Cloth is coated at a temperature below about 1000° C. with amorphous boron-carbon deposits in a process which provides a substantially uniform coating on all the filaments making up each yarn fiber bundle of the cloth. The coated cloths can be used in the as-deposited condition for example as wear surfaces where high hardness values are needed; or multiple layers of coated cloths can be hot-pressed to form billets useful for example in fusion reactor wall armor. Also provided is a method of controlling the atom ratio of B:C of boron-carbon deposits onto any of a variety of substrates, including cloths.

10 Claims, 1 Drawing Figure

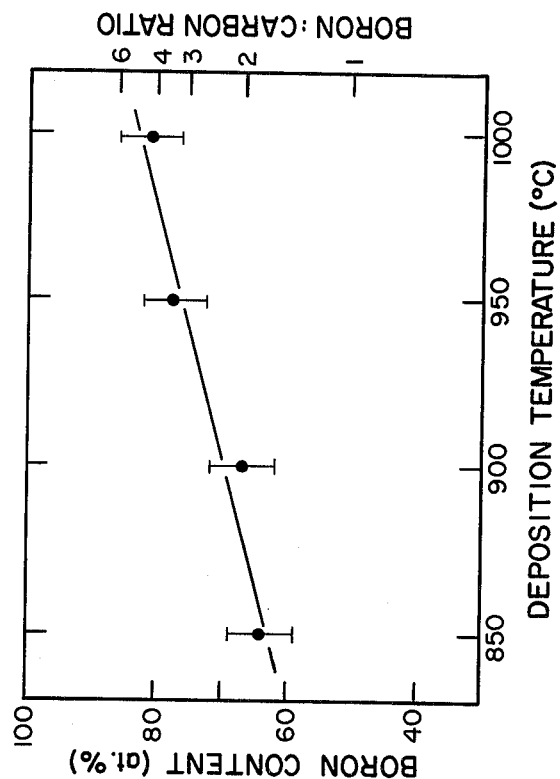

PREPARATION AND USES OF AMORPHOUS BORON CARBIDE COATED SUBSTRATES

This invention is a result of a contract with the Department of Defense, Naval Surface Weapons Center, P.O. N60921-78-PO-W011S (July 6, 1978) and P.O. N60921-79-PO-W0031 (Nov. 3, 1978).

BACKGROUND OF THE INVENTION

1. Field of the Invention

This invention relates generally to a method of coating various substrates with deposits of amorphous boron carbide, to uses of the coated substrates, and to articles of manufacture thus produced from the coated substrates. It relates in particular to coating cloth substrates.

Amorphous (i.e., substantially non-crystalline) boron-carbon deposits, either in the form of boron carbide or in non-stoichiometric mixtures of boron and carbon, are known to possess desirable mechanical properties, for example very high tensile strength and modulus of elasticity. Previously, in order to produce boron-carbon deposits by chemical vapor deposition (i.e., CVD), temperatures well above 1100° C. usually have been required. At such temperatures the deposits are usually crystalline. These high temperatures also destroy or cause degradation of many substrate materials and at such temperatures the individual filaments making up the fibers of a cloth cannot be uniformly coated. Only the outer, not inner, portions of the cloth would be coated, and the cloth would be canned. Thus, it has been a problem to obtain high quality deposits, and particularly at economical speeds.

2. Prior Art

In U.S. Pat. No. 3,537,877, Reeves et al., amorphous boron-carbon deposits were produced by contacting a heated substrate material with a gaseous mixture of acetylene and a boron hydride at a relatively low temperature and pressure. That process has the serious disadvantage, however, that boron hydride (a borane) is a very toxic substance. Thus, its use in a reaction is undesirable. That patent furthermore does not teach or suggest hot-pressing multiple layers of coated cloth, nor does it teach a method of controlling the ratio of B:C in boron-carbon deposits.

Leclerq et al., U.S. Pat. No. 3,846,224, Wainer et al., U.S. Pat. No. 3,269,802, and Bauer, U.S. Pat. No. 3,994,248, do not even address (much less solve) the problem of canning. Thus, those patents do not lead one to a method of coating a cloth with boron carbide so that all of the tiny yarn filaments making up a yarn bundle are substantially uniformly coated. In order to avoid canning, both a low temperature and a low pressure must be used; and such a dual requirement is not taught in those patents. Leclerq et al. furthermore coats a single filament, not a multifilamentary yarn as in the present invention; and in that patent in the preferred coating temperature range (1150°-1300° C.), canning would definitely occur. Additionally in Wainer et al., the reactants are different from those used in the present invention, in Wainer a carbon substrate reacting with a halide in the absence of a hydrocarbon gas so as to form a carbide.

Turkat, U.S. Pat. No. 3,294,880, Bourdeau, U.S. Pat. No. 3,369,920, Bourdeau, U.S. Pat. No. 3,334,967, and Basche, U.S. Pat. No. 3,464,843, all employ high temperatures (at least 1300° C.) in their coating reactions. As noted above, at these temperatures canning would occur.

Additionally, none of the patents cited above nor any other known reference teaches a method for controlling the atom ratio of B:C in boron carbide deposits. And no other reference teaches hot pressing of cloth which has been uniformly coated with boron carbide as in the present invention.

OBJECTS OF THE INVENTION

It was an object of this invention to produce high quality amorphous boron carbide deposits on cloth made of any of a variety of substrate materials at an economical rate at a temperature well below 1100° C. using the reactants boron trichloride, at least one hydrocarbon, and hydrogen.

Another object of this invention was to obtain cloths coated with boron carbide which would be suitable for utilization as structural reinforcements.

A further object was a method of depositing boron carbide onto a variety of substrates (cloth and other substrates) so that the deposits would contain a controlled atom ratio of boron:carbon.

Yet another object of this invention was a method of using boron carbide-coated graphite cloth so as to provide a heat sink material which would have high resistance to spalling (i.e., chipping) and which thus would be suitable for use in a fusion reactor as wall armor, beam stops, limiters, and other similar articles.

Other objects, advantages and novel features of the invention will become apparent to those skilled in the art upon examination of the following detailed description of a preferred embodiment of the invention and the accompanying drawings.

SUMMARY OF THE INVENTION

According to the invention, a method for uniformly coating cloth substrate fibers with boron carbide comprises: contacting the substrate with a gaseous mixture of boron trichloride, at least one hydrocarbon, and hydrogen at a temperature higher than about 700° but lower than about 1000° C. at a total pressure within the range from about 1 torr to about 300 torr. The compositions thus produced are suitable for a variety of uses, including wear surfaces requiring high melting temperatures. Multiple layers of the thus-coated cloths can then be hot-pressed at a temperature within the range from about 1500° C. to about 2300° C. and at a pressure within the range from about 14 MPa to about 100 MPa for a length of time sufficient to form a unified structure. Also according to the invention, the hot-pressed unified structure is used as a spall-resistant structure, for example in a fusion reactor.

And according to the invention, a method of producing amorphous boron-carbon deposits having a controlled atom ratio of B:C lying within the range of about 1:1 to about 14:1 comprises operating a CVD reaction of boron trichloride, a particular hydrocarbon or particular mixture of hydrocarbons, and hydrogen in the presence of a substrate at a total pressure within the range from about 1 to about 300 torr and at a particular temperature selected as described below.

BRIEF DESCRIPTION OF THE DRAWING

The FIGURE is a graph of the variation of boron content of boron-carbon deposits obtained at various deposition temperatures using propene as the reacting hydrocarbon. The boron content is given both as an atomic percent and as an atom ratio of B:C. The total pressure in each run was a pressure within the range from 15 to 35 torr.

DESCRIPTION OF THE PREFERRED EMBODIMENTS

The method of uniformly coating a cloth according to the invention satisfies the objects cited above and results in a product having many advantages. Cloth has not previously been coated with boron carbide, nor has it even been known to be advantageous to coat a cloth with boron carbide particularly so that the individual filaments of the cloth are uniformly coated, nor has it been known how to produce a cloth uniformly coated with boron carbide without the occurrence of canning (i.e., coating only the outer, not inner, portions of the cloth).

Using the coating method according to the invention, a highly uniform protective coating of boron carbide on a cloth substrate is achieved. Furthermore, because the substrate is in the form of a cloth and because each individual fiber making up each yarn strand in the cloth is substantially uniformly coated with boron carbide, if the coating is ruptured, damage would be restricted to the individual filaments involved and attack on the cloth itself would be minimized. Thus, the coated cloth in both the as-deposited and hot-pressed condition is expected to be highly spall-resistant. Additionally, because the coating actually coats each filament uniformly as opposed to coating only the surface of a fiber bundle, the coating adheres to the substrate very well. Additionally, when graphite is the type of cloth which is coated with the particular boron-carbon deposit $B_4C$, the electrical conductivity of a hot-pressed billet of the coated cloth is much greater than that of prior art $B_4C$ powder which has been hot-pressed.

Furthermore, boron-carbide deposits having a controlled atom ratio of B:C can be prepared. This is significant because plasma erosion resistance is expected to be substantially affected by this ratio. This resistance is expected to increase as the boron fraction increases. Although it is expected that the atom ratio of B:C on substrates other than cloth can also be controlled by this method, it is preferred to use cloth as the substrate because of the utility of coated cloth.

When multiple layers of the boron carbide uniformly coated cloth are hot-pressed in one embodiment, according to the invention, the hot-pressed product has the following advantages. It contains only low atomic number elements (and thus is useful in fusion reactors, as described below), is hard and spallation resistant, and is expected to be resistant to attack by hydrogen.

The energy absorption capability of this ceramic body reinforced with fibers should be enhanced as compared with the energy absorption capability of an unreinforced ceramic body. Furthermore, the relative volume percents of boron carbide and carbon (or graphite) can be varied in the process according to the invention. If desired, additional boron carbide powder can also be layered in with the layers of boron carbide coated cloth.

The coating conditions required to uniformly deposit boron carbide onto cloth have been determined through relatively extensive experimental effort.

The type of cloth which is coated with boron carbide in the practice of the invention can be any cloth which does not react substantially with boron carbide and which has a melting point higher than the particular coating temperature selected to be used in the coating reaction, described below. Cloth which is to be further subjected to hot-pressing must also have a melting temperature above the hot-pressing temperature. Carbon, graphite, and other ceramics (i.e., materials made by the baking or firing of nonmetallic material) are suitable for being coated in the coating method of the invention and for being hot-pressed to form billets. When the cloth being coated is to be used at high temperatures as a heat sink material for use in fusion reactors, preferably the cloth will be made of graphite. This is so because in fusion reactors, components such as wall armor and similar articles preferably should contain only low atomic number elements in order to minimize plasma quenching by beam-induced sputtered products; and, additionally, they should have a high melting temperature and good thermal fatigue resistance.

The reactant gases used in the chemical vapor deposition reaction to coat the cloth substrate with boron carbide are boron trichloride, at least one hydrocarbon, and hydrogen.

Boron trichloride can either be purchased or can be generated by direct chlorination of boron at about 570° C. When a boron chlorinator is used for in-situ preparation of boron trichloride, small particulates of carbon (formed in the chlorinator by pyrolysis of residual chlorocarbons contained in commerical chlorine), are entrained in the gas stream and are deposited on the first few cloths which the boron trichloride contacts. These particulates increase the rigidity of the first few cloths, thus necessitating careful handling to prevent breaking when they are loaded into the die. When commercial boron trichloride is used, the particulates are absent and the requirement for special handling is eliminated.

The hydrocarbon or mixture of hydrocarbons can be selected broadly. Any saturated or unsaturated aliphatic or aromatic hydrocarbon or hydrocarbons can be used. An example of a suitable aromatic hydrocarbon is benzene; and examples of suitable aliphatic hydrocarbons are propene ($C_3H_6$), acetylene ($C_2H_2$), methane ($CH_4$), and propane ($C_3H_8$). Propene and methane have been used in the method of this invention and gave good results.

When propene is the hydrocarbon used, the deposition reaction is represented by the equation:

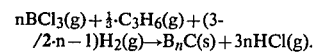
$$nBCl_3(g) + \tfrac{n}{3} \cdot C_3H_6(g) + (3n/2 \cdot n - 1)H_2(g) \rightarrow B_nC(s) + 3nHCl(g).$$

It was found that the value of n increases with deposition temperature when the hydrocarbon used is propene and is equal to 4 at 980° C. This is shown in FIG. 1, which is further described below.

In experiments which were done comparing the use of propene with methane, the temperature having been held contant at 900° C. for both hydrocarbons and the total pressure lying within the range from 15–35 torr for all runs, it was found that the boron carbide deposited had a B:C atom ratio of about 2.6 when propene was used, whereas the B:C atom ratio was about 14 when methane was used. Therefore, if a boron-rich deposit is desired, methane would be preferred to propene.

Additionally, if one wishes to control the molar ratio of B:C, one should carefully select the temperature because the B:C ratio in the deposited material is sensitive to the deposition temperature used. Shown in the drawing is a graph of boron content variation with deposition temperature. The data for 850°, 900°, and 950° C. represent the means (with one standard deviation) for 2-6 different coated cloths, whereas that at 1000° C. was determined from a single, coated cloth. All runs were made at a total pressure within the range from 15 to 35 torr. These data suggest that a method of controlling the boron content of the deposited boron carbide for a particular hydrocarbon used in the chemical vapor deposition reaction comprises obtaining a graph such as that shown in the drawing by operating the CVD reaction for a particular hydrocarbon at several deposition temperatures while holding the total pressure substantially constant, determining the atomic percent of boron in each boron carbide deposit, and then plotting atomic % versus deposition temperature. Then, using the graph, one can select the deposition temperature which will produce the desired B:C atom ratio in the deposit. Additionally, as suggested above, the ratio can be even more widely varied by choice of the particular hydrocarbon used. For each particular hydrocarbon, a graph as described above can be obtained.

It has been found that uniform penetration of the fiber bundles can be achieved only when the temperature is lower than about 1000° C. The temperature should be at least about 700° C. in order for the chemical vapor deposition reaction to proceed. When propene is the hydrocarbon used in the chemical vapor deposition reaction and when graphite is the cloth being coated, often the coating temperature will be within the range from about 800° to about 950° C.; however, the optimum coating temperature is in the range from about 850° to about 900° C. because in that range the best deposits are obtained.

The pressure used in the coating chamber should be reduced to within the range from about 1 torr to about 300 torr in order to avoid canning of the cloth substrate. Preferably, the pressure will be within the range from about 15 to about 35 torr and more preferably will be about 25 torr. It has been found that for a given deposition temperature, using propene as the hydrocarbon, the B:C atom ratio in the deposited material is relatively insensitive to the B:C atom ratio in the reacting gas mixture for a deposition temperature from about 850° to about 1000° C.

The chemical vapor deposition reaction will be allowed to proceed for a length of time which is chosen so that canning of the fiber bundles does not occur, generally less than about 1000 minutes. When the deposit is $B_4C$ and the cloth is WCA graphite (described below), for example, it has been found that the maximum $B_4C$ content that can be deposited before the onset of canning of the fiber bundle is approximately 35 volume percent. At a deposition temperature of 890° C., it has been found that the maximum amount of boron carbide that can be uniformly deposited on filaments of WCA graphite cloth (defined below in the Examples) is 100–110 wt% gain, corresponding to a coating time from about 290 to about 390 minutes. Therefore, in general, the coating time should not be excessive, but rather should be selected to maximize the amount of boron carbide deposited without the onset of canning.

When coating gases are passed through a stack of cloth disks, the amount of boron carbide deposited on each disk decreases approximately linearly in the direction of gas flow. With stacks of 8 disks, it was found that uniform loadings of ±5 weight percent boron carbide could be achieved by inverting the disks for a second coating run which was processed for 12% longer time than the first.

After the cloth is uniformly coated, it can be subjected to the following procedures. Multiple layers of the uniformly coated cloth can be subjected to hot-pressing to form a billet. The conditions will generally include a temperature within the range from about 1500° C. to about 2300° C., a pressure within the range from about 14 MPa to about 100 MPa, and a time sufficient to densify the deposit (generally within the range from about 5 min. to about 200 minutes). Preferably, the temperature will be within the range from about 1900° to about 2100° C., the pressure will be within the range from about 20 to about 40 MPa, and the time will be within the range from about 10 to about 30 minutes.

EXAMPLES

The following examples illustrating various embodiments of the invention were carried out. Boron trichloride was prepared by in-situ chlorination of boron at 570° C. The boron trichloride was mixed with hydrogen and with a hydrocarbon which was either propene or methane, and the mixture was injected into the coating chamber. A 3-zone electrical resistance furnace was used to heat the coating chamber. A thermocouple placed in contact with the coating chamber wall at the mid-point of the zone containing the cloth was used to measure the deposition temperature. The pressure within the coating chamber was monitored through the hydrogen supply line.

EXAMPLE 1

The cloth which was coated in this example was Union Carbide WCA cloth made of graphite. It had an areal density of 0.0244 g/cm$^2$ and was woven from yarn containing 1440 filaments, each filament being about 9 μm in diameter. The cloth had a plain weave and had a warp of 27 yarns/inch and a fill of 21 yarns/inch. Circular pieces of cloth about 16 cm in diameter were stretched over a 13.3 cm o.d. graphite holding hoop and were held in place by compressing the excess circumferential material down over the hoop with an external graphite compression ring. Several of these disks were then stacked in a 17 cm. i.d. coating chamber in such a manner that the reactant gases flowed through the cloths in series. Four graphite baffles placed above the cloths and separated by spacers served to heat the coating gases to the deposition temperature. Deposition was carried out at a reduced pressure of 15 to 25 torr. The deposition parameters are given below in Table I, the time of coating at 850° C. having been 360 minutes; at 900° C., 160 minutes; and at 1000° C., 270 minutes.

TABLE I

| | |
|---|---|
| chlorine flow to boron chlorinator (cm$^3$/min) | 323 |
| propene flow (cm$^3$/min) | 14.8 |
| hydrogen flow (cm$^3$/min) | 10,500 |
| dposition temperature(°C.) | 850—1,000 |
| deposition time (min) | 160-360 |

X-ray diffraction analysis of the deposited material showed an amorphous structure.

Photomicrographs were made of the inner regions of yarn strands coated at 850°, 900°, and 1000° C. It was observed that uniformity of penetration was somewhat better at 850° than at 900° C., although both appeared to be suitable for hot-pressing. The material coated at 1000° C. was observed from the photomicrograph to be canned (i.e., only the outer filaments were coated, not the inner).

The coated cloth in the as-deposited condition is expected to be useful as a covering for walls of radiators, for example, or as a wear surface requiring a high hardness value. It is known to be useful as an intermediate in the production of hot-pressed billets.

EXAMPLE 2

Two boron carbide-carbon hot-pressed billets were prepared, one of them containing 27 vol% boron carbide and the other containing 43 vol% boron carbide. They were made from Union Carbide WCA graphite cloth which was coated at approximately 20 torr and 1000° C., although samples prepared from material deposits at 850° and 900° C. are expected to have significantly better microstructure and other improved properties, including flexure strength. For each billet, 10 layers of coated cloth were hot-pressed at 2100° C. and 32 MPa for 15 minutes.

In the 27 vol% sample, examination of photomicrographs of the microstructure of the sample showed that excellent compaction was achieved by hot-pressing; however, the integrity of the graphite fibers appears to have been damaged by reaction with the boron carbide. The data presented in FIG. 1 (discussed above) suggests that the B:C atom ratios in both the 27 vol% sample and the 43 vol% sample were approximately equal to 5. Because the B-$B_4C$ eutectic is approximately 2075° C., liquid phase may have been present during hot-pressing leading to reorganization (i.e., recrystallization) of the graphite fibers. It is believed that this reorganization would not be a problem for hot-pressing of material coated in the range of about 850° to about 900° C. because then the B:C atom ratio is less than 4 (See FIG. 1) and the $B_4C$-C eutectic temperature is approximately 2375° C., according to F. A. Shunk, "Constitution of Binary Alloys, 2nd Suppl.," McGraw-Hill (New York, 1969) 100.

X-ray diffraction measurements on the hot-pressed samples showed that the amorphous deposit had transformed to hexagonal $B_4C$ ($a_o$=5.621 Å, $c_o$=12.093 Å).

The electrical conductivities of both hot-pressed billets were measured and are given below in Table II. For comparison, the electrical conductivity of hot-pressed $B_4C$ powder is also given.

TABLE II

| Electrical properties of $B_4C$/C composites | | |
|---|---|---|
| Composition (vol. % $B_4C$) | Density (g/cm$^3$) | Electrical Conductivity ($\Omega^{-1}$cm$^{-1}$) |
| 27 | 1.71 | 441 |
| 43 | 1.87 | 204 |
| 100* | 2.47 | 28 |

*$B_4C$ powder hot-pressed at 2050° C. and 21 MPa.

From the data in Table II, one can see that the boron carbide-carbon hot-pressed billets, even when prepared from cloth coated at 1000° C., have electrical properties which would make the composites suitable for use in fusion reactor wall armor.

EXAMPLE 3

In the following example a different type of graphite cloth was coated in a different geometric arrangement, as compared with Example 1. Here 20 cloths each 13.3 cm in diameter cut from Fiberite Corporation W321 graphite cloth were placed in a single stack with the cloths positioned adjacent to each other in the same apparatus described in Example 1. No hoops (as used in Example 1) were here used; and the stack of cloths was supported by a graphite grid. The W321 cloth had a plain weave, with a warp of 8 and a fill of 8. It had an areal density of 0.0247 g/cm$^2$ and was woven from yarn which was pan-T300. The cloths were coated for 330 min. at the conditions listed below in Table III, and then the stack of cloths was inverted and coated an additional 360 min.

TABLE III

| | |
|---|---|
| Boron trichloride flow | 332 (cm$^3$/min) |
| Propene flow | 30 cm$^3$/min |
| Hydrogen flow | 40,000 cm$^3$/min |
| Deposition temperature | 900° C. |

The average amount of boron carbide deposited on the 20 cloths was 37 vol%. The stack was hot-pressed at 2050° C. and 32 MPa for 15 min. resulting in a circular plate which was solid, as determined visually.

This plate was then cut up into billets, 10 of which were subjected to a test of their flexure strengths. The measurements were made in accordance with the procedure set forth in *Formulas for Stress and Strains*, 5th ed., R. J. Roark and W. C. Young, chapter 7, "Beams: Flexure of Straight Bars," Table III, case 1e. For the 10 pieces, the average flexure strength was 59 megapascals (MPa), the individual values having ranged from 51 to 68.

The coating geometry described above resulted in a more efficient use of reactants than the geometry used in Example 1. It is expected that the flexure strength of billets prepared from cloth coated at 900° C. (as in this example) will have a higher flexure strength than billets prepared from cloth coated at 1000° C. (as in Example 2) because the quantity of coating of the yarn filaments is better at 900° C. than at 1000° C. (as described in Example 1).

The foregoing description of preferred embodiments of the invention has been presented for purposes of illustration and description and is not intended to be exhaustive or to limit the invention to the precise forms disclosed. It was chosen and described in order to best explain the principles of the invention and their practical application to thereby enable others skilled in the art to best utilize the invention in various embodiments and with various modifications as are suited to the particular use contemplated. It is intended that the scope of the invention be defined by the claims appended hereto.

What is claimed is:

1. A method of coating graphite cloth with a coating of amorphous boron carbide which is substantially uniform on all filaments throughout each yarn bundle of said cloth, said method comprising: contacting said graphite cloth with a mixture of $BCl_3$, at least one hydrocarbon selected from the group consisting of propene and methane, and hydrogen at a coating temperature within the range from about 850° to about 900° C. and at a total pressure within the range from about 15 torr to about 35 torr.

2. A method of producing a hot-pressed billet, said method requiring no additional adhesive material and comprising: hot-pressing multiple layers of graphite cloth coated according to the method of claim 1 in a die at a hot-pressing temperature within the range from about 1900° to about 2100° C., at a hot-pressing pressure within the range from about 20 to about 40 MPa, and for a period of time of hot-pressing within the range from about 10 to about 30 minutes.

3. A method according to claim 2 wherein said hot-pressing temperature is about 2100° C., wherein said hot-pressing pressure is about 32 MPa, wherein said period of time of hot-pressing is about 15 minutes, and wherein 10 layers of coated cloth are hot-pressed.

4. An article of manufacture prepared according to the method of claim 3.

5. An article of manufacture comprising a unified, compacted, hot-pressed structure comprising a multiplicity of layers of ceramic cloth formed from multifilamentary ceramic yarn, substantially all tiny filaments of which are surrounded by and separated from each other by interstitially deposited boron carbide.

6. An article of manufacture according to claim 5, wherein said hot-pressed structure has been compacted sufficiently so that it has a density which is near theoretical density and wherein theoretical density is defined by the formula:

$$\text{Theoretical Density} = \left(\text{Volume percent of coating material}\right)\left(\text{Density of coating material}\right) + \left(\frac{100 - \text{Volume percent of coating material}}{}\right)\left(\text{filament cloth density}\right)$$

7. An article according to claim 6, wherein said ceramic cloth comprises graphite cloth.

8. An article according to claim 7, wherein said interstitially deposited boron carbide has an atom ratio of B:C lying within the range from about 1:1 to about 14:1.

9. An article according to claim 8, wherein said interstitially deposited boron carbide is $B_4C$, wherein the content of $B_4C$ is less than about 35 volume percent, and wherein said hot-pressed structure consists of $B_4C$ and graphite cloth.

10. An article according to claim 9 wherein said $B_4C$ is amorphous and wherein said hot-pressed structure has a density which differs from said theoretical density by less than about 1.5%.

* * * * *